United States Patent [19]
Paik et al.

[11] Patent Number: 6,124,149
[45] Date of Patent: Sep. 26, 2000

[54] METHOD OF MAKING STACKABLE SEMICONDUCTOR CHIPS TO BUILD A STACKED CHIP MODULE

[75] Inventors: Kyung Wook Paik; Jin Su Kim; Hyung Su Ko, all of Daejon, Rep. of Korea

[73] Assignee: Hyundai Electronics Industries Co., Ltd., Ichon, Rep. of Korea

[21] Appl. No.: 09/184,514

[22] Filed: Nov. 2, 1998

[30] Foreign Application Priority Data

Nov. 19, 1997 [KR] Rep. of Korea ................ 61039/97

[51] Int. Cl.[7] ............................. H01L 21/48; H01L 21/50
[52] U.S. Cl. ...................... 438/107; 438/109; 438/110; 438/113
[58] Field of Search ........................... 438/106, 107, 438/108, 109, 110, 112, 113, 114, 118, 127

[56] References Cited

U.S. PATENT DOCUMENTS

| | | | |
|---|---|---|---|
| 5,675,180 | 10/1997 | Pedersen et al. | 257/685 |
| 5,904,502 | 5/1999 | Ference | 438/118 |
| 5,952,725 | 9/1999 | Ball | 257/777 |

*Primary Examiner*—Charles Bowers
*Assistant Examiner*—Evan Pert
*Attorney, Agent, or Firm*—Fleshner & Kim, LLP

[57] ABSTRACT

A stackable semiconductor chip package, methods of fabricating the chip package, and a stacked semiconductor chip module are disclosed. In the chip package or the chip module, lateral surfaces of each semiconductor chip are insulated with insulation regions that are formed while the chip is still part of an uncut wafer. The fabrication methods include the steps of: preparing an uncut wafer having multiple chip portions; forming slots along a pair of opposed lateral sides of the chip portions; filling the slots with an insulating material; forming a first insulation layer on an upper surface of the wafer; forming via holes in the first insulation layer so that chip pads formed in each chip portion are exposed through the via holes; forming a plurality of conductive patterns on the first insulation layer so that the conductive patterns are electrically coupled to the chip pads through the via holes; forming a second insulation layer on the conductive patterns and the first insulation layer; and cutting the wafer along the cutting lines. In alternate methods, two or more wafers may be stacked before the cutting step is performed. This results in the formation of multiple stacked chip modules.

18 Claims, 5 Drawing Sheets

METHOD OF MAKING STACKABLE SEMICONDUCTOR CHIPS TO BUILD A STACKED CHIP MODULE

BACKGROUND OF THE INVENTION

1. Field of the Invention

The present invention relates to a stackable semiconductor chip package, methods of making the chip package and a stacked semiconductor chip module.

2. Background of the Related Art

Generally, a 3-dimensional chip stacking technique is used for implementing a highly-integrated semiconductor chip package having a high capacity and small size. Examples of these techniques are disclosed in U.S. Pat. No. 5,104,820 and U.S. Pat. No. 5,279,991.

FIG. 1 shows an uncut wafer having a chip portion 11. As shown in FIG 1, in the 3-dimensional chip stacking technique disclosed in U.S. Pat. No. 5,104,820, a plurality of pads 12 aligned on the upper surface of each chip portion 11 are extended, using conductive patterns 13, to lateral portions of the chip 11. This is done while the wafer is still uncut. The wafer is then cut into a plurality of parts as semiconductor chips, each having realigned pads 14. The cut and separated semiconductor chips are stacked to form a semiconductor chip module, and the lateral portions of each semiconductor chip are insulated. To accomplish the lateral surface insulation process, the semiconductor chips having the realigned pads are first stacked in a multiple-tier structure. The lateral portions of each semiconductor chip are etched so that the end portions (realigned pad portions) 14 of the conductive patterns 13 are not damaged, and a polymer insulation member is filled into the etched portions. This insulates the lateral portions of each semiconductor chip.

The 3-dimensional chip stacking technique disclosed in the U.S. Pat. No. 5,104,820 has several disadvantages. First, since the lateral portion insulating process is performed after a wafer has been cut into chips, and the chips have been stacked to form a chip module, wafer conventional processing techniques cannot be used to accomplish the lateral insulation process. Second, in order to form the realigned pads 14, areas of the wafer that would normally be used to form neighboring chips are used, and the yield of the semiconductor chip fabrication is decreased.

In the 3-dimensional chip stacking technique disclosed in U.S. Pat. No. 5,279,991, chip modules, each consisting of a plurality of semiconductor chips having realigned pads, are stacked to form a large unit of stacked modules. The lateral portions of each semiconductor chip are then insulated. The large unit of the stacked modules may then be separated into smalls units of modules, if necessary, based on the purpose of its use.

However, in this technique, since some processes are performed on the stacked semiconductor chips in a manner similar to that of U.S. Pat. No. 5,104,820, known wafer processing techniques are not used to form the lateral insulation portions. This makes the fabrication processes complicated, and some additional apparatus is needed.

The above references are incorporated by reference herein where appropriate for teachings of additional or alternative details, features and/or technical background.

SUMMARY OF THE INVENTION

It is an object of the present invention to provide a stackable semiconductor chip package, and a stacked semiconductor chip module which overcomes problems encountered in the background art.

It is another object of the present invention to provide a stackable semiconductor chip package and a stacked semiconductor chip module wherein the lateral surfaces of each semiconductor chip are insulated while the chip is still part of an uncut wafer.

A method of fabricating a chip package embodying the invention includes the steps of preparing a uncut wafer having at least one chip portion; forming slots along opposed lateral edges of the chip portion; filling the slots with an insulating material; forming a first insulation layer on an upper surface of the wafer; forming a via hole in the first insulation layer so that a chip pad of the chip portion is exposed through the via hole; forming a conductive pattern on the first insulation layer; forming a second insulation layer on the conductive pattern and the first insulation layer; and cutting the wafer to form at least one chip.

In a method of forming a stacked semiconductor chip module embodying the invention, several uncut wafers prepared as described above can be stacked and bonded to one another so that individual chip portions in the wafers are vertically aligned. A cutting process can then be performed to separate the individual chip portions of each wafer from one another. The result will be a plurality of stacked chip modules.

In methods embodying the present invention, the fabrication processes are simplified compared to the known lateral surface insulating technique, where the lateral surfaces of each semiconductor chip are insulated after the chips are stacked into a semiconductor chip module.

A stackable semiconductor chip package embodying the invention includes a chip having a plurality of chip pads; a first insulation layer formed on the chip, wherein a plurality of apertures are formed in the first insulation layer at locations corresponding to the chip pads; a plurality of conductive patterns formed on the first insulation layer so that first ends of the conductive patterns extend into the via holes and are electrically coupled to the chip pads, and wherein second ends of the conductive patterns are exposed at lateral sides of the chip package; and a bonding layer formed over the conductive patterns and the first insulation layer, wherein the bonding layer is configured to bond a top surface of the chip package to a bottom surface of another chip package.

A stackable semiconductor wafer embodying the invention includes a wafer having at least one chip portion with chip pads, wherein insulation regions are formed in the wafer along lateral sides of the at least one chip portion, and wherein the insulation regions comprise slots filled with an insulating material; a first insulation layer formed on the wafer wherein via holes are formed in the first insulation layer to expose chip pads of the at least one chip portion; a plurality of conductive patterns formed on the first insulation layer wherein first ends of the conductive patterns extend into the via holes and are electrically coupled to corresponding chip pads, and wherein second ends of the conductive patterns extend to lateral edges of the at least one chip portion; and a bonding layer formed on the conductive patterns on the first insulation layer, wherein the bonding layer is configured to bond the wafer to another wafer.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

Preferred embodiments of the present invention will be described with reference to the accompanying drawings, wherein like elements are labeled with like reference numbers, and wherein.

DETAILED DESCRIPTION OF PREFERRED EMBODIMENTS

Figure 1:
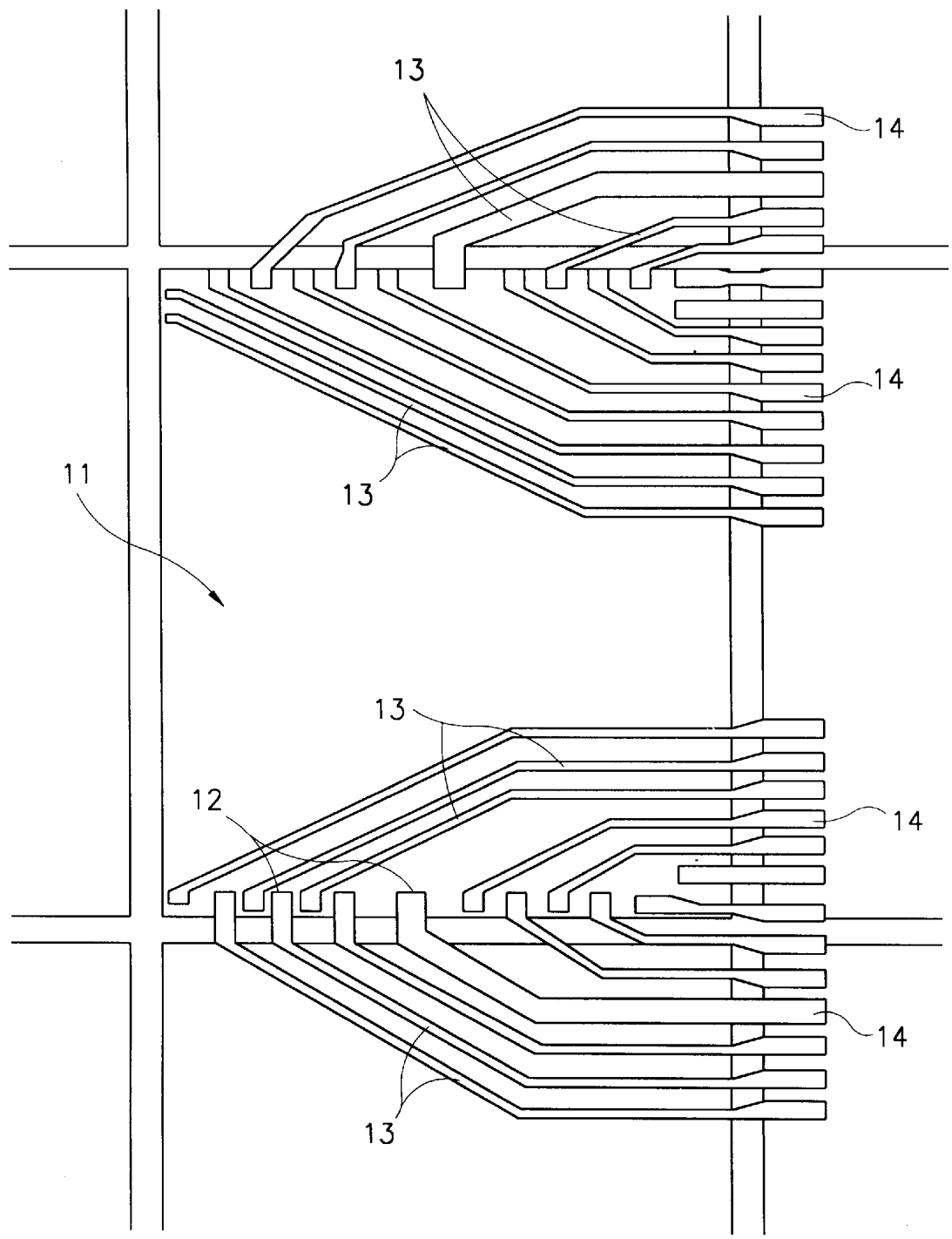
FIG. 1 is a plan view illustrating a pad layout for semiconductor chips formed according to a background art 3-dimensional chip stacking technique.
Figure 2:
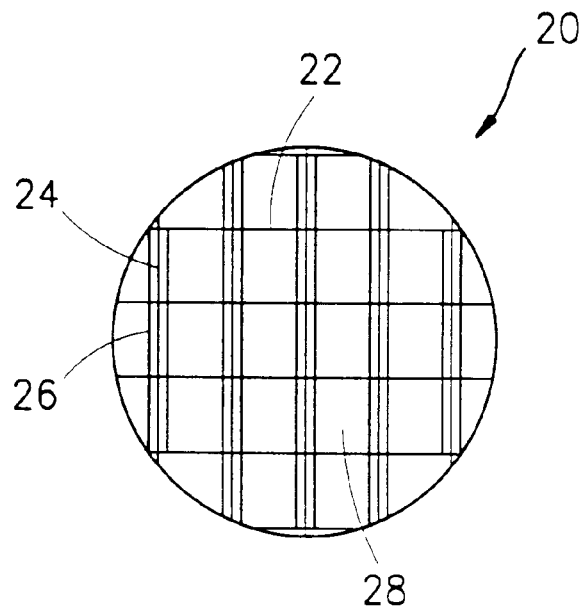
FIG. 2 is a plan view illustrating an uncut wafer embodying the present invention.

FIG. 2 is a plan view illustrating an uncut wafer which is used in a method embodying the present invention. As shown in FIG. 2, first direction cutting lines 22 and second direction cutting lines 24 (which are perpendicular to the first direction cutting lines 22) are formed on the upper surface of the uncut wafer 20. In addition, hole (slot) formation lines 26 are formed on the other side of the second direction cutting lines 24. The hole (slot) formation lines 26 are defined to correspond with a pair of opposed sides of each semiconductor chip portion 28 of the wafer.

Figure 3A:
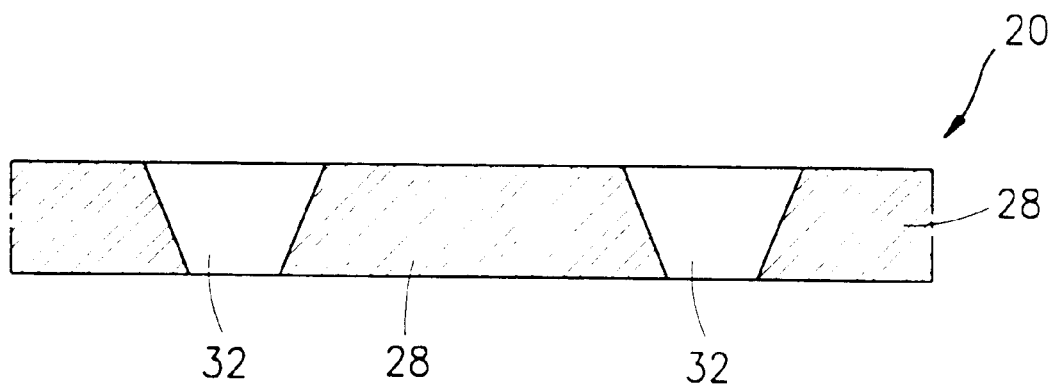
FIGS. 3A through 3G are cross-sectional views illustrating a method of fabricating a stackable semiconductor chip according to the present invention.

FIG. 3A is a cross-sectional view of a portion of the wafer shown in FIG. 2. The wafer 20 is cut, using a diamond slant cutting method, along the hole formation lines 26 to form holes (slots) 32 along lateral sides of the chip portions 28. Alternatively, an etching process may be performed, based on known semiconductor fabrication techniques, to form the holes (slots) 32 in the wafer 20.

Figure 3B:
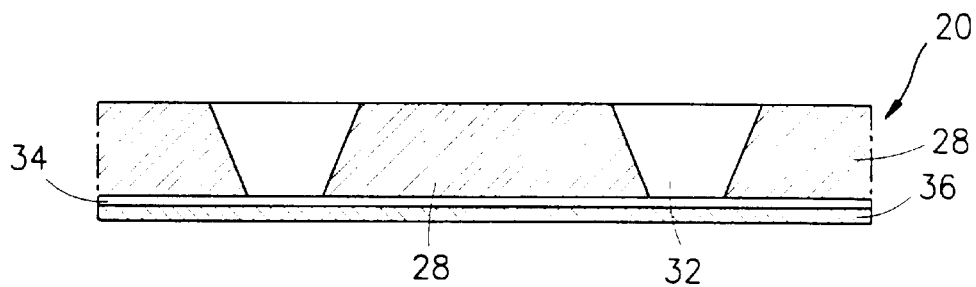

As shown in FIG. 3B, a lower insulation layer 36 is then formed on the lower surface of the wafer 20 using an insulation bonding member 34. To decrease a stress which occurs in the interface between the wafer 20 and the lower insulation layer 36, the insulation bonding member 34 is formed to a thickness below about 10 $\mu$m using a thermoetherimide, which is a plastic polymer bonding member, and the lower insulation layer 36 is formed of a polymer film (for example, KAPTON film of a polyamide group) having a low heat expansion coefficient.

Figure 3C:
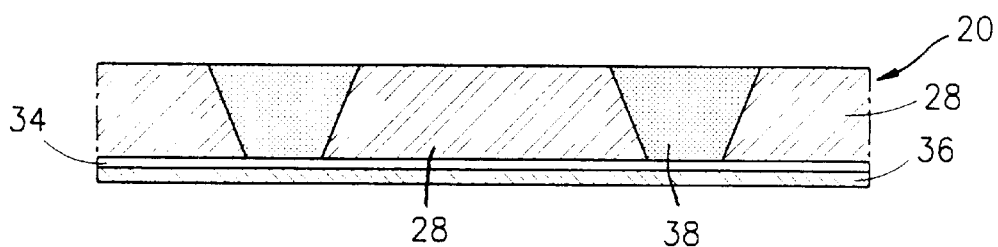

Next, as shown in FIG. 3C, an insulating material 38 such as a thermoetherimide is filled into the holes (slots) 32. The resultant structure is then heat-treated. The insulating material 38 could also be an ULTEM member.

Figure 3D:
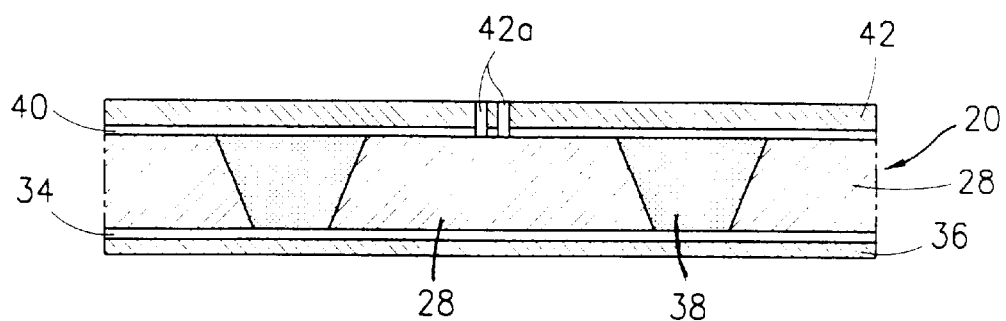

As shown in FIG. 3D, an upper insulation layer 42 is formed on the upper surfaces of the insulating material portions 38 and the wafer 20 using an insulation bonding member 40. To reduce the stress which may occur in the interface between the wafer 20 and the upper insulation layer 42, the insulation bonding member 40 is formed to a thickness below about 10 $\mu$m using a thermoetherimide, as was used when forming the lower insulation layer 36. The upper insulation layer 42 is formed of a polymer film (for example, KAPTON film of a polyamide group) having a low heat expansion coefficient.

A plurality of via holes 42a are then formed in the upper insulation layer 42, and the insulation bonding member 40. The via holes 42a are formed so that chip pads (not shown) aligned on the upper surface of each semiconductor chip portion 28 are exposed by the via holes 42a.

Figure 3E:
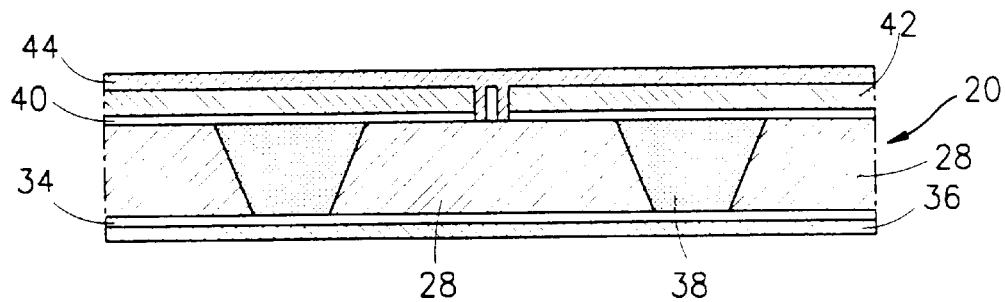

As shown in FIG. 3E, a conductive layer is formed on the upper insulation layer 42, and the conductive layer is patterned. The result is a plurality of conductive patterns 44, each of which corresponds to a chip pad. One end of each of the conductive patterns 44 is electrically connected with a chip pad through a corresponding via hole 42a, and the other end of each of the conductive patterns 44 extends to a lateral surface of each semiconductor chip portion 28. The conductive patterns 44 may be formed of a Ti/Al (2 $\mu$m) layer. The Al helps to conduct electricity and the Ti provides a better bonding force between the Al and the upper insulation layer 42.

Figure 3F:
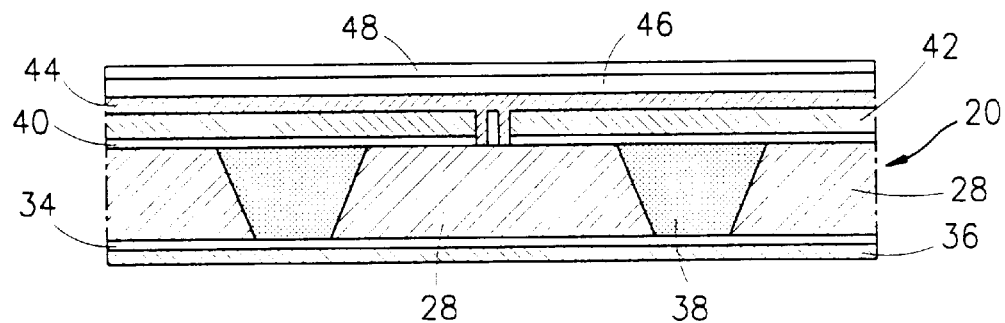

As shown in FIG. 3F, a cap insulation layer 46 is formed on the upper surfaces of the upper insulation layer 42 (which is exposed between the conductive patterns 44) and the upper surfaces of the conductive patterns 44. A bonding layer 48 is formed on the upper surface of the cap insulation layer 46. Here, the formation process of the upper insulation layer 46 includes a step in which a thermoetherimide (for example, ULTEM) is filled into gaps formed between the conductive patterns 44 and a step in which a polymer film (for example, KAPTON) having a low heat expansion coefficient is formed on the resultant structure. The bonding layer 48 is formed of the same material as the insulation bonding members 34 and 40 and then a heating process is performed on the resultant structure.

Figure 3G:
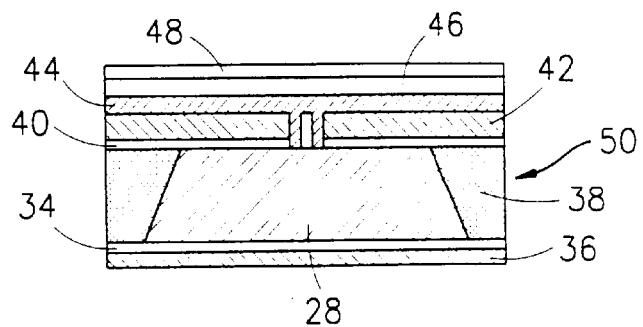

Finally, as shown in FIG. 3G, a wafer cutting process is performed along the cutting lines 22 and 24 on the wafer 20, to separate the wafer 20 into stackable semiconductor chips 50.

Figure 4:
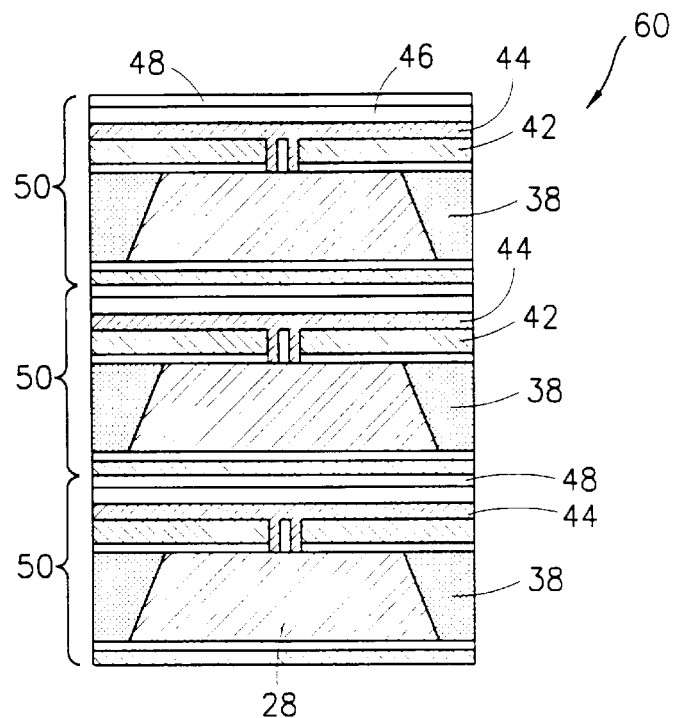
FIG. 4 is a cross-sectional view illustrating a stacked semiconductor chip module according to the present invention.

FIG. 4 is a cross-sectional view illustrating a stacked semiconductor chip module 60 according to the present invention. As shown in FIG. 4, the semiconductor chips 50 are stacked in multiple tiers, and then the resultant structure is heat-treated and is pressurized, so that the semiconductor chips 50 are attached to one another by the bonding force of the bonding layer 48. The lateral surfaces of each semiconductor chip 28 are fully insulated by the insulating material portions 38.

In an alternate method embodying the invention, semiconductor chip module 60 is fabricated by stacking multiple wafers 20 in tiers before the wafer cutting process is conducted. The cutting process is then performed, resulting in the formation of a plurality of 3-dimensional stacked semiconductor chip modules 60.

Figure 5:
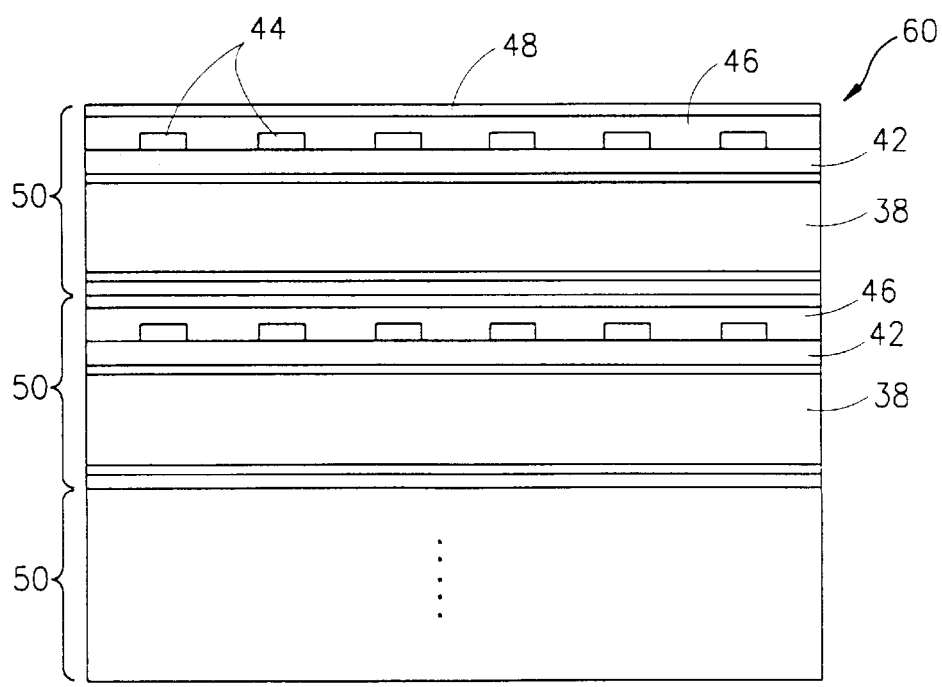
FIG. 5 is a side view illustrating the stacked semiconductor chip module of FIG. 4.

FIG. 5 is a side view of the stacked semiconductor chip module 60 of FIG. 4 according to the present invention. As shown therein, a plurality of conductive patterns 44, which provide an electrical path to the chip pads of the semiconductor chip 28, are exposed from the lateral surfaces of the semiconductor chip module 60. The conductive patterns 44 are electrically insulated from one another by the insulation layers 42 and 46. External terminals (not shown) which are electrically coupled with the conductive patterns 44 may be formed by performing a metallization process with respect to the lateral surface of the module 60. The external terminals (not shown), such as solder balls, are formed so that it is possible to fabricate a high capacity semiconductor chip package using a stackable semiconductor chip.

As described above, in a fabrication method of a 3-dimensional stackable semiconductor chip according to the present invention, lateral surfaces of each semiconductor chip are insulated using known wafer processing steps before the wafer is separated into individual chips. Thus, it is possible to simplify the fabrication processes. Also, because the method does not utilize portions of a wafer near or surrounding the chip portions, it is possible to increase the yield of a wafer, further reducing costs.

The foregoing embodiments are merely exemplary and are not to be construed as limiting the present invention. The present teaching can be readily applied to other types of applications. The description of the present invention is intended to be illustrative, and not to limit the scope of the claims. Many alternatives, modifications, and variations will be apparent to those skilled in the art.

What is claimed is:

1. A method of fabricating a stackable semiconductor chip, comprising the steps of:

preparing a semiconductor wafer having at least one chip portion having defined lateral side boundaries;

forming at least one slot in the wafer coincident with at least one of said lateral side boundaries of the at least one chip portion exposing at least one lateral side of said chip portion;

filling the at least one slot with an insulating material thereby covering said exposed at least one lateral side;

forming a first insulation layer on an upper surface of the wafer;

forming at least one via hole in the first insulation layer so that a chip pad of the at least one chip portion of the wafer is exposed through the at least one via hole;

forming at least one conductive pattern on the first insulation layer;

forming a second insulation layer on the at least one conductive pattern and on the first insulation layer; and cutting the wafer to form at least one chip including cutting said insulating material filled in said at least one slot.

2. The method of claim 1, wherein the step of preparing a semiconductor wafer comprises forming first direction cutting lines and second direction cutting lines for cutting the wafer on an upper surface of the wafer, and forming hole formation lines that correspond with one of the first and second direction cutting lines.

3. The method of claim 1, further comprising a step of forming a third insulation layer on a lower surface of the wafer.

4. The method of claim 3, wherein said third insulation layer is formed using an insulation bonding member.

5. The method of claim 4, wherein said insulation bonding member is formed of a plastic polymer bonding member having a thickness of less than about 10 μm.

6. The method of claim 4, wherein said third insulation layer is formed of a polymer film having a low heat expansion coefficient.

7. The method of claim 1, wherein the step of forming at least one slot comprises forming slots along a pair of opposing lateral edges of the at least one chip portion.

8. The method of claim 1, wherein said insulating material used to fill the at least one slot comprises a plastic polymer bonding material.

9. The method of claim 1, wherein said first insulation layer is formed using an insulation bonding member.

10. The method of claim 9, wherein said insulation bonding member is formed of a plastic polymer bonding member having a thickness less than about 10 μm.

11. The method of claim 9, wherein said first insulation layer is formed of a polymer film having a low heat expansion coefficient.

12. The method of claim 1, wherein the at least one conductive pattern is formed such that a first end of each at least one conductive pattern is electrically coupled to a corresponding chip pad of the at least one chip portion through a via hole.

13. The method of claim 12, wherein the at least one conductive pattern is also formed such that a second end of each at least one conductive pattern is exposed at a lateral surface of a chip after the cutting step is performed.

14. The method of claim 1, wherein the step of forming at least one conductive pattern comprises forming the conductive pattern of Ti and Al.

15. The method of claim 1, wherein said first insulation layer is formed of a plastic polymer bonding member and a polymer film layer.

16. The method of claim 1, further comprising a step of forming a bonding layer on the second insulation layer.

17. A method of forming a stacked semiconductor chip module, comprising the steps of:

(a) preparing an uncut wafer having at least one chip portion having defined lateral side boundaries;

(b) forming at least one slot in the wafer coincident with at least one of said lateral side boundaries of the at least one chip portion exposing at least one lateral side of said chip portion;

(c) filling the at least one slot with an insulating material thereby covering said exposed at least one lateral side;

(d) forming a first insulation layer on an upper surface of the wafer;

(e) forming at least one via hole in the first insulation layer such that a chip pad of the at least one chip portion is exposed through the at least one via hole;

(f) forming at least one conductive pattern on the first insulation layer;

(g) forming a second insulation layer on the at least one conductive pattern and the first insulation layer;

(h) stacking at least two wafers prepared according to steps (a)–(g); and (i) cutting the stacked wafers to separate the wafers into at least one stacked semiconductor chip module including cutting said insulating material filled in said at least one slot.

18. The method of claim 17, further comprising a step of forming a third insulation layer on a lower surface of the wafer.

* * * * *